United States Patent [19]
Bosch et al.

[11] Patent Number: 5,159,346
[45] Date of Patent: Oct. 27, 1992

[54] VOLTAGE CONTROLLED OSCILLATOR

[75] Inventors: Donald N. Bosch, Plymouth, Minn.; James B. Beyer; Robert L. Cravens, both of Madison, Wis.; Stanley E. Swirhun, Apple Valley, Minn.

[73] Assignee: Alliant Techsystems Inc., Edina, Minn.

[21] Appl. No.: 712,931

[22] Filed: Jun. 10, 1991

[51] Int. Cl.⁵ .......................... G01S 7/35; H03B 5/36
[52] U.S. Cl. .................................. 342/175; 342/200; 331/116 FE
[58] Field of Search ............ 331/116 FE, 117 FE; 342/200, 175, 201, 128

[56] References Cited

U.S. PATENT DOCUMENTS 4,216,443  8/1980  Zaderej ................... 331/117 FE X
4,931,799  6/1990  Wen et al. .................. 342/175 X

OTHER PUBLICATIONS

Master's Thesis "Development of a Broadband Microwave Oscillator", by Robert L. Cravens.

Primary Examiner—Gilberto Barrón, Jr.
Attorney, Agent, or Firm—Merchant, Gould, Smith, Edell, Welter & Schmidt

[57] ABSTRACT

A voltage controlled oscillator (VCO 10) is disclosed in a "ring" configuration using two FETs. Two isolated voltage control terminals provide increased tuning bandwidth. The design uses an active feedback topology resulting in greater device size for higher output power and circuit Q.

21 Claims, 5 Drawing Sheets

VOLTAGE CONTROLLED OSCILLATOR

TECHNICAL FIELD OF THE INVENTION

The present invention relates generally to an electrical circuit, and more particularly to a voltage controlled oscillator using two FETs in a ring configuration.

BACKGROUND OF THE INVENTION

Millimeter-wave Field Effect Transistor ("FET") based MMICs are replacing hybrid circuit functions, such as amplification, mixing and switching. However, currently there are few millimeter-wave monolithic FET based Voltage Controlled Oscillators ("VCOs") and no reports of millimeter-wave high electron mobility transistor ("HEMT") based VCOs.

Additionally, there have been only relatively few attempts at monolithic millimeter-wave GaAs VCO designs and even fewer employ active elements (i.e., metal epitaxial semiconductor FETs: "MESFETs") as tuning elements. In one instance, varactor diode tuning elements have been added to a standard 0.25 um gate-length MESFET fabrication sequence; however, the increased process complexity required (i.e., Me V ion implantation) is difficult, especially in order to ensure compatibility with HEMTs. While conventional FET-only grounded-gate oscillator circuit architecture has no compatibility problems, it exhibits a tuning range and circuit Q performance limitation tradeoff primarily because the diminished gain and higher series resistance of the single FET active element as the gate bias approaches pinchoff.

Previously, as alluded to above, FET oscillators consisted of one FET device utilizing a shorted gate. These devices are commonly known as "common gate" oscillators. While such oscillator devices work in a satisfactory manner, the negative resistance for the device is inherently limited in a narrow band and, therefore, must be redesigned to set negative resistance if a different resonator is used with the device. Additionally, since only one device was previously utilized, a large device to increase output power could not be used while still maintaining the negative resistance required for oscillation.

Therefore, there is a need for a voltage controlled oscillator having very broad band negative resistance, a large tuning bandwidth, active feedback to enable use of a large FET for output power, and lower phase noise.

SUMMARY OF THE INVENTION

The present invention provides for a simple-to-integrate, compact and flexible millimeter-wave VCO design. The VCO is preferably co-integrated with either MESFET or HEMT amplifier or mixer circuits.

In a preferred embodiment of the VCO constructed according to the principles of the present invention, the VCO comprises a pair of FETs (Q1 and Q2) connected in a "ring-type" configuration. The FETs are connected such that the drain of the first FET (Q1) is connected to the gate of the second FET (Q2), and the drain of the second FET (Q2) is connected to the gate of the first FET (Q1). Oscillations build up to a steady state level from broad band thermal noise.

Oscillations start with Q1/R1, with the oscillations being amplified and phase shifted 180° to the Q1 drain output/Q2 gate input. Q2 provides active amplitude feedback and a 180° phase shift to the Q2 drain output. Thus, the feedback wave form adds in phase with the Q1 input, while the output oscillation amplitude increases until Q1/Q2 saturation.

One feature of the present invention is that the dual FET gate control produces a wider frequency tuning bandwidth than that of the conventional common gate oscillators. This is due to the present invention's ability to adjust the gate voltage of two devices which then changes the gate-source capacitance, in turn changing the oscillation frequency of the VCO. The two tuning controls are isolated from one another and can be used to perform different functions (i.e., frequency tuning and frequency temperature compensation simultaneously).

A second advantage is that use of the two FETs provide for a broad band negative resistance, enabling use of virtually any resonator. For example, a microstrip line resonator may be used or a YIG type resonator. The use of any resonator is accomplished by the ability to change the center frequency of the VCO by as much as a decade or more in specific applications. Additionally, since the gate-source tuning is utilized, an implanted varactor is unnecessary.

A third advantage is that the resonator is isolated from the load (i.e., the RF output load). This minimizes load pull effects on the VCO. The resonator in a common-gate oscillator is not isolated from the load.

Still another feature of the present invention is the use of active feedback which enables use of a very large FET for output power. Previous one FET oscillator designs, which utilized passive feedback, could not incorporate a large device and still maintain a negative resistance required to oscillate.

Yet another feature of the present invention is the reduction of phase noise accomplished by reducing the size of the series coupling capacitors. While a smaller bandwidth is the tradeoff for improving the phase noise, the large bandwidth addition of the wide frequency tuning bandwidth (discussed above), enables a decreased phase noise while still maintaining a larger tuning bandwidth of the circuit. As those skilled in the art will recognize, phase noise in a radar system determines the minimum resolution of the system. Therefore, by reducing the phase noise, the minimum resolution of the system is improved.

Therefore, according to one aspect of the invention, there is provided a voltage control oscillator comprising: a) a first field effect transistor ("FET"), having a drain, a gate and a source; b) a second FET, having a drain, a gate and a source, wherein said drain of said first FET is cooperatively connected to said gate of said second FET and said drain of said second FET is cooperatively connected to said gate of said first FET; and c) first and second voltage means, cooperatively connected to said gate of said first and second FETs respectively, for supplying a voltage to said first and second FETs, whereby when a resonator is cooperatively connected to said drain of said second FET, the frequency of the oscillator is controlled, said first and second FET having a negative resistance over the center bandwidth of the resonator frequency such that active feedback causes oscillations.

According to another aspect of the invention, there is provided a device for generating a signal comprising: (a) a first active voltage controlled variable resistor means having three ports for controlling the resistance between a first port and a second port by varying a voltage supplied to said first active resistor means; (b) a second active voltage controlled variable resistor means having three ports for controlling the resistance between a third port and a fourth port by varying a voltage supplied to said second active resistor means, wherein said first and second active resistor means are connected to one another such that active feedback occurs between said first and second active resistor means when biased thereby creating an oscillation signal; and (c) resonator means, cooperatively connected to said first active resistor means, for controlling the frequency of the oscillation signal.

These and other advantages and features which characterize the present invention are pointed out with particularity in the claims annexed hereto and forming a further part hereof. However, for a better understanding of the invention, its advantages and objects obtained by its use, reference should be made to the Drawings which form a further part hereof and to the accompanying descriptive matter, in which there is illustrated and described a preferred embodiment of the present invention.

BRIEF DESCRIPTION OF THE DRAWINGS

In the Drawings, wherein the like parts are referenced by like numerals throughout the several views.

DETAILED DESCRIPTION

The principles of this invention apply particularly well to a voltage controlled oscillator utilizing FETs, and in particular a Ka-Band MMIC voltage controlled oscillator. A preferred application for this invention is in a radar environment, wherein lower phase noise, higher bandwidth tuning, and/or a larger output power is required. Such preferred application, however, is typical of only one of the innumerable types of applications in which the principles of the present invention can be employed.

Figure 1:
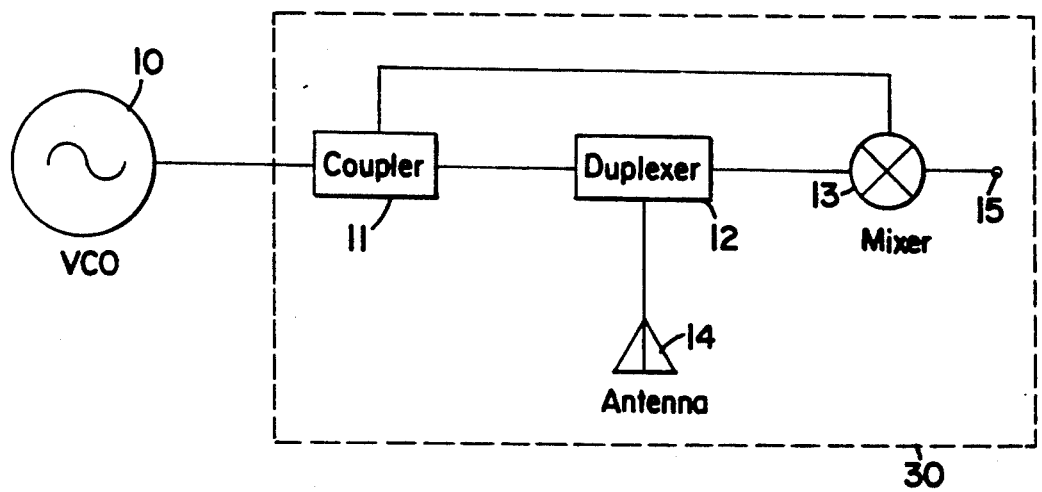
FIG. 1 is a block diagram illustrating application of the present invention in a radar system.

Referring now to the Figs., there is illustrated a preferred embodiment of a ring VCO circuit. The VCO is shown generally at 10. In FIG. 1, the VCO 10 is illustrated as being connected to a radar system 30. Those skilled in the art will appreciate the components of such a radar system 30 and its operation. Therefore, the system 30 will not be described in detail herein, other than to briefly note the various components illustrated in FIG. 1. VCO 10 is connected to a coupler 11 which provides the mixer 13 with local oscillator ("LO") drive. In turn, coupler 11 is linked to a duplexer 12 and a mixer 13. The duplexer 12 permits simultaneous antenna transmit and receive, while providing transmit and receive isolation. Mixer 13 provides a difference frequency of the receiver RF and LO. The antenna 14 is connected to the duplexer 12 of the radar system. Also connected to the mixer 13 is the intermediate frequency output.

MMIC VCO Design

Figure 2:
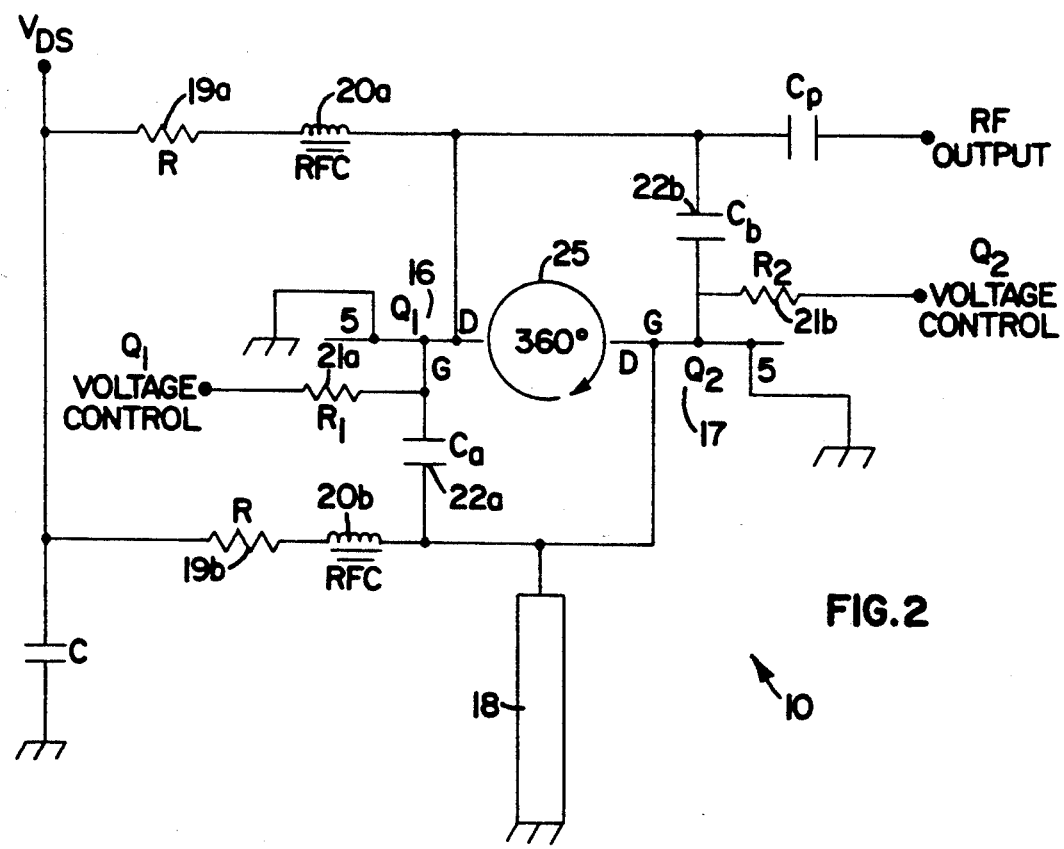
FIG. 2 is a circuit schematic of a preferred embodiment VCO 10 constructed according to the principles of the present invention.

Referring next to FIG. 2, a preferred Ka-band VCO 10 circuit is illustrated. The drain of Q1 is connected through the biasing network resistor 19A and RFC ("RF choke") 20A to voltage VDS. RFC 20 prevents high frequency signals from propagating on the bias network. The gate of Q1 16 is connected via R1 21A to Q1 voltage control and also via AC signal path capacitor CA 22A to the drain of Q2 17. The source of Q1 16 is connected to ground. The drain of Q2 17 is connected to the bias network via resistor 19B and RFC 20B to VDS. The gate of Q2 17 is connected via resistor R2 to the Q2 voltage control, and also via AC path capacitor CB to the drain of Q1 16. The source of Q2 17 is connected to ground.

Resonator 18 is connected to the drain of Q2 17 and the RF output is connected via capacitor CP to the drain of Q1 16. The circle designated by the number 25 illustrates the path of the signal through the two FETs 16, 17.

The VCO 10 is a common-source oscillator, employing two FETs (Q1 16 and Q2 17) in a "ring" configuration with each FET gate AC connected to the other FET drain. VCO 10 comprises the two FETs 16, 17, inductive resonator 18, and an embedded bias network. The resonator is preferably a microstrip line since it can be easily integrated with the circuit. The bias network also comprises series drain resistors 19a, 19b which prevent low frequency resonances established by the drain bond wires and the circuit capacitance.

In operation, oscillations build up to a steady state level from broad band thermal noise. Oscillations start with Q1/R1, with the oscillations being amplified and phase shifted 180° to the Q1 drain output/Q2 gate input. Q2 provides active amplitude feedback and a 180° phase shift to the Q2 drain output. Thus, the feedback wave form adds in phase with the Q1 input, while the output oscillation amplitude increases until Q1/Q2 saturation.

As noted, the two FETs 16, 17 provide "active feedback" over a broadband because each gate-drain junction provides a 180 degree phase shift which is virtually independent of frequency. As a result, the "ring" oscillator configuration exhibits a broadband negative resistance over a decade in frequency for the preferred 0.25 $\mu$m gate length MESFET and HEMT active devices (discussed below).

As those skilled in the art will appreciate, the gate-source capacitance ("Cgs") changes as a function of gate voltage as the tuning element. The capacitance formed by the combination of (a) the input capacitance of one FET in the ring configuration and (b) the output capacitance of the second FET is resonated with a shorted inductive microstrip line. This makes a very compact, easily integrated MMIC. Thus, a similarity to the shorted gate oscillator concept exists, but with some very important improvements.

Two isolated voltage control terminals exist; one at the gate of Q1 and the second at the gate of Q2, an immediate improvement of twice the tuning bandwidth over the conventional shorted gate oscillator method. In addition, the active feedback of Q2 sustains negative resistance to device pinch-off, thus further increasing the tuning bandwidth.

Figure 3:
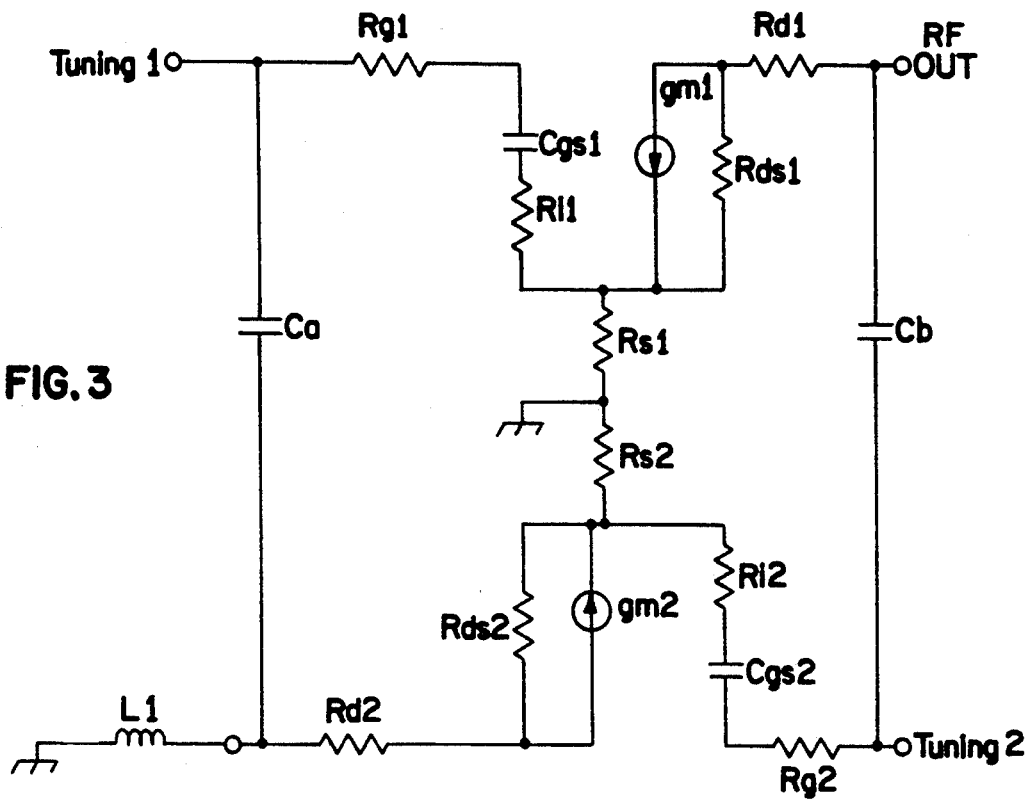
FIG. 3 is an equivalent small signal circuit schematic of the VCO 10 of FIG. 1.

A second advantage, lower phase noise, is also obtainable with this circuit. In order to better illustrate this advantage, reference should be had to FIG. 3 which sets forth VCO 10 equivalent circuit. To more easily understand the operation of VCO 10, assume Q1 16 device gate width is much larger than Q2 17. Then:

$$Cgs1 > Cgs2 \text{ and } Cgs1 >> Cds2 \quad (1)$$

Figure 4:
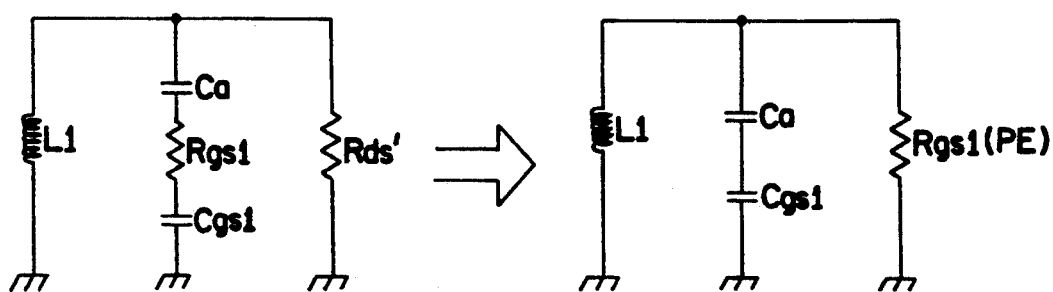
FIG. 4 is a circuit schematic illustrating the reduction of the resonant circuit of VCO 10 of FIG. 1.

If we let $$Rgs1 = Rg1 + Ri1 + Rs1 \quad (2)$$

and $$Rds' = Rd2 + Rds2 \quad (3)$$

then the resonant circuit may be further reduced to the circuit illustrated in FIG. 4.

Since the gate width of Q2 17 is much less than Q1 16, $$Rds' >> Rgs1 \quad (4)$$

(parallel equivalent). Therefore, those skilled in the art will recognize that Rds has little effect on the circuit Q. By selecting the series gate DC blocking, capacitor Ca=Cgs1, then from equation (6) below circuit Q is improved by a factor of two.

$$Q = (X/r) = (1/Rgs1\omega(Ca \cdot Cgs1/Ca + Cgs1)) \quad (5)$$
$$= (2/Rgs2\omega Cgs) \text{ when } Ca = Cgs1 \quad (6)$$

Using the series combination of Ca and Cgs1 makes explicit the phase-noise/tuning bandwidth tradeoff; a larger Ca/Cgs1 ratio improves tuning bandwidth at the expense of phase noise.

A further benefit of this circuit is the high output power capability associated with a large Q1 16, since VCO 10 is a common source design, virtually all of the power is delivered to the load. Q2 lightly taps the output of Q1, thus little power is lost due to the feedback illustrated in FIG. 2 by line 25. The output impedance of the ring oscillator circuit is relatively low compared to Zout of the shorted gate oscillator, because of the large device size of Q1 and the common source configuration. This simplifies the output impedance match and lowers the required drain-source voltage supply in comparison to a single FET common gate design.

Three versions of the Ka-band VCo were designed, using 50, 100 and 150 μm wide Q1 16 FETs and 50 μm Q2 17 FET. Only the 100 μm wide FET was RF characterized in detail. Chip size was a very compact 30×34 mils, approximately a factor of four smaller than previous reports. However, the designed versions are presented herein for the purposes of illustration only, and should not be considered limiting. Any type of FET device may be utilized in accordance with the principles of the present invention. Further, it appears, although not yet tested, that other types of transistor devices (e.g. hetro-junction bipolar and bipolar junction transistors) might also be utilized to construct VCO 10.

Fabrication

Figure 5:
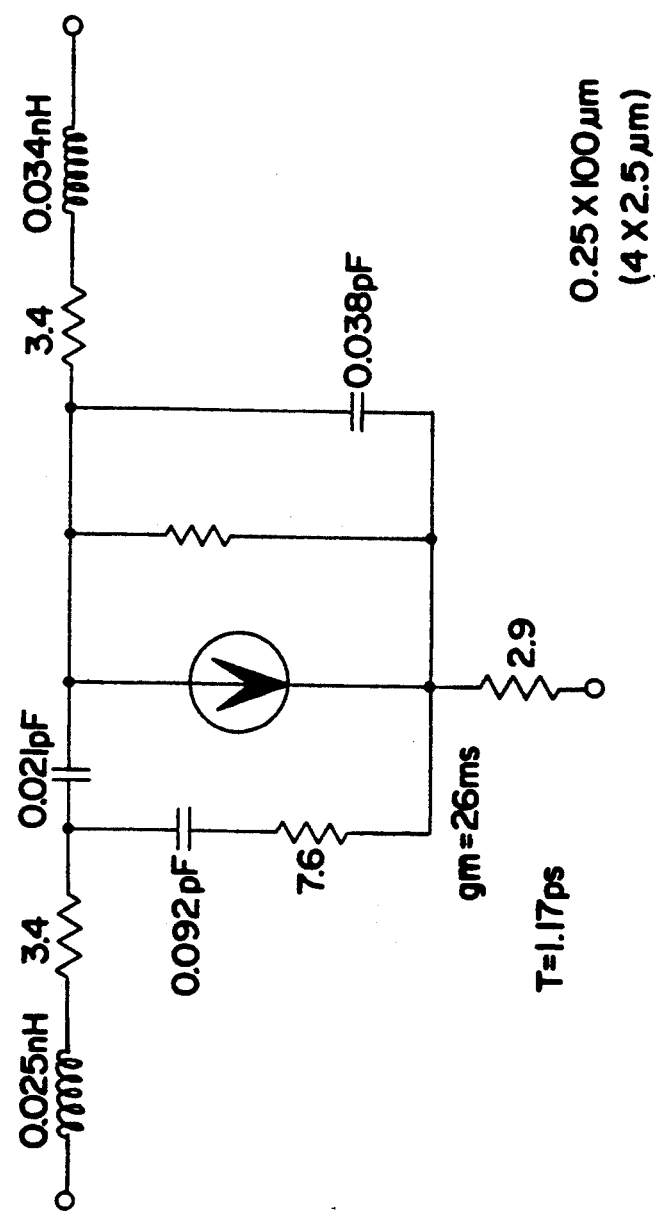
FIG. 5 is a circuit schematic of a MESFET equivalent circuit of VCO 10 of FIG. 1;.

The VCO 10 was fabricated with both MESFET and HEMT device technologies primarily to allow a circuit phase noise performance comparison. FIG. 5 illustrates the small signal equivalent circuit model used for the circuit simulation and design. This model was extracted from fitting on-wafer [S] measurements of a 0.25×100 μm ion-implanted MESFETs and an MBE grown AlGaAs/GaAs HEMTs fabricated using the Honeywell millimeter-wave recess-gate technology. The MESFET and HEMT equivalent circuits demonstrate unity current gain cutoff frequencies of approximately 35 GHz and 55 GHz and $F_{max}$ over 110 GHz and 120 GHz, respectively.

Figure 6:
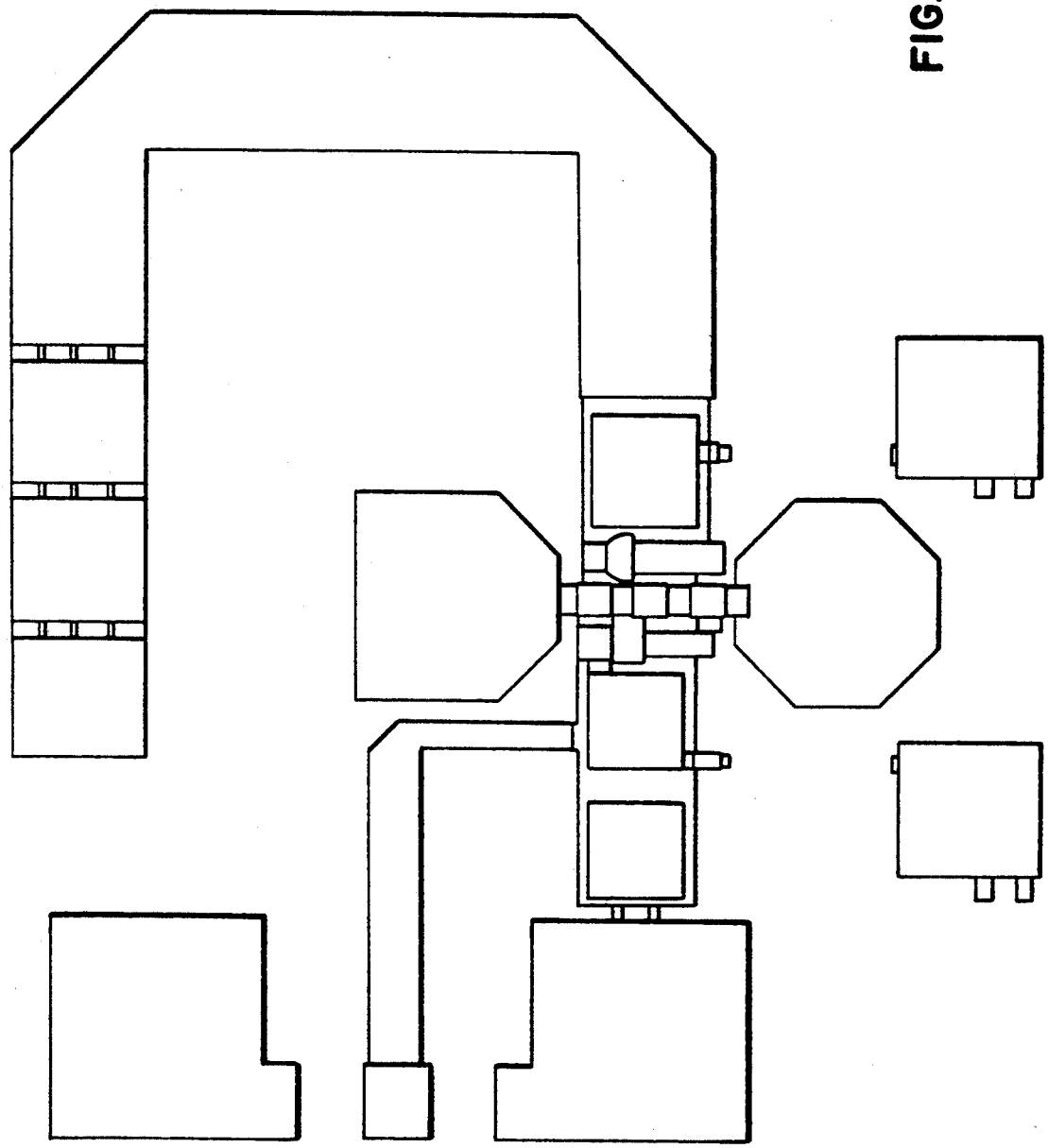
FIG. 6 is a top view illustration of a completed Ka-Band MMIC VCO wafer construction of VCO 10 of FIG. 1.

The MESFET wafers were ion implanted with Si29 at 50 and 100 KeV at 1 e13/$cm^2$ dose. The HEMT wafers used a conventional 380 A n:AlGaAs layer doped to 2e18/$cm^2$ with a 500 A heavily doped GaAs cap layer. Fabrication was completely planar. Bulk resistors were used. Ion implanted isolation was followed by ohmic contact formation and electron-beam defined recess-gate formation. Metal-insulator-metal capacitors and FET passivation were formed with 2000 A of chemical vapor-deposited silicon nitride. Transmission lines were plated to 1.6 μm. The wafers were thinned to 100p 10 μm and reactively ion-etched through wafer vias were used. Typical FET parameter uniformity was 10 percent across the 3-inch wafers. FIG. 6 illustrates the completed MMIC oscillator.

Measurements

Figure 7:
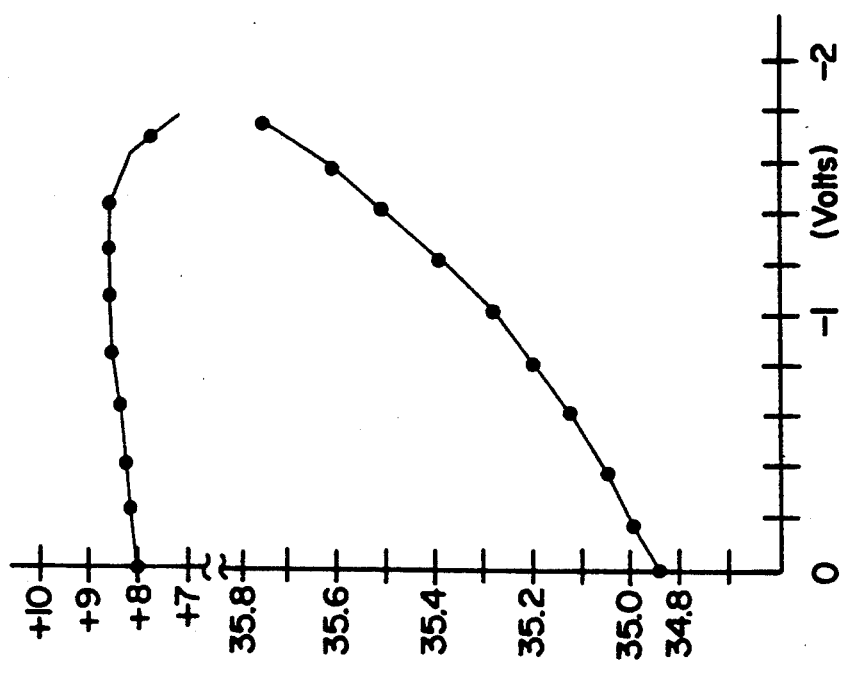
FIG. 7 is a graph illustrating 100 micrometer MESFET performance of VCO 10 of FIG. 1.

The VCOs oscillated at the desired frequency after trimming of the airbridge resonator line shown—in FIG. 6. Tuning bandwidth of a preferred MESFET design is 740 MHz, centered at 35.3 GHz. The output power is 8.3+0.3 dBm. FIG. 7 illustrates the MESFET VCO output power and frequency versus modulation voltage, where the modulation voltage is applied to the gate of Q1 16 and the Q2 17 gate voltage was fixed at −0.5V (i.e., negative 0.5 volts). Using both gate controls the tuning bandwidth is greater than 1.2 GHz. FM phase noise (measured as the −3 dB noise equivalent bandwidth) was 200 kHz.

Those skilled in the art will recognize the increased performance for a millimeter-wave MMIC VCO in terms of power output×tuning range. A 150 μm shorted gate oscillator (with gate control as tuning element) with similar doping levels produced a tuning bandwidth of 450 MHz and output power of 8 dBm, thus demonstrating a 3:1 tuning bandwidth improvement for the "ring" configuration. The shorted gate oscillator exhibited similar phase noise characteristics.

HEMT VCOs of the same "ring" design as the MESFET demonstrated similar performance in terms of center frequency and output power, except for three important parameters:

Frequency-modulation linearity was superior for the HEMT VCOs.

Tuning bandwidth was 25 percent greater.

The −3 dB phase noise bandwidth of the HEMT VCO was significantly worse than the MESFET VCO.

Figure 8:
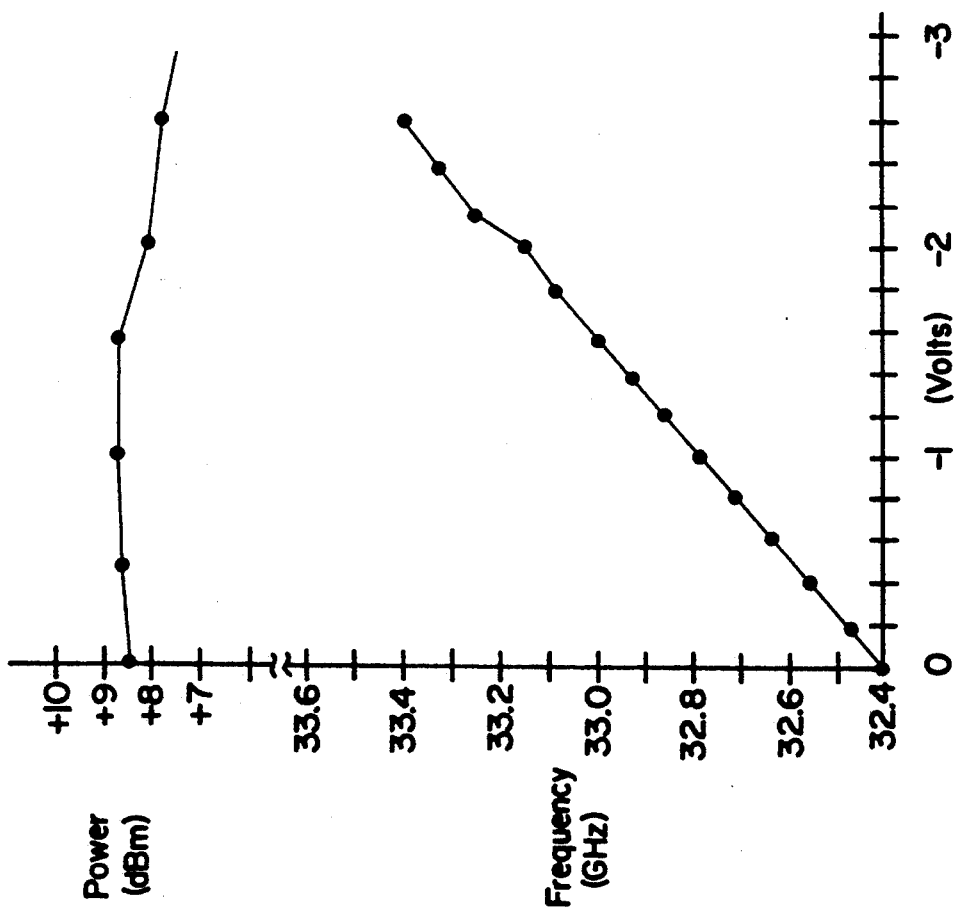
FIG. 8 illustrates 100 micrometer HEMT performance of VCO 10 of FIG. 1.

FIG. 8 illustrates the HEMT VCO output power and frequency vs. modulation voltage. The greater tuning bandwidth and improved linearity are attributed to the lower HEMT gate current near Idss. Typical FM phase noise bandwidths were 600 kHz for otherwise identical HEMT VCOs. This important result is the first data of phase noise in millimeter-wave HEMT oscillators and the first comparison of phase noise in ion implanted MESFET and HEMT oscillators.

A third preferred "ring" VCO 10 employing very highly doped MESFET material yielded 1.2 GHz tuning bandwidth and a 60 kHz 3dB noise equivalent bandwidth. This improvement in VCO phase noise confirms previous work suggesting that lower 1/f flicker noise of FETs is accomplished by increasing the doping levels. As a comparison, a typical varactor tuned GUNN diode microstrip VCO 3 dB noise equivalent bandwidth is 1-6 KHz.

It will be appreciated that the foregoing measurements are presented by way of example of characteristics of embodiments of VCO 10 and should not be viewed as limiting.

It will also be appreciated that the principles of this invention apply not only to the circuitry used to implement the invention, but also to the method of generating an oscillation frequency to a radar system.

While a particular embodiment of the invention has been described with respect to its application for use in a radar system, it will be understood by those skilled in the art that the invention is not limited by such application or FET embodiment, or to the particular circuits disclosed and described herein. It will be appreciated by those skilled in the art that other circuit configurations that embody the principles of this invention and other applications therefor, other than as described herein, can be configured within the spirit and intent of this invention. The circuit configuration described herein is provided as only one example of a preferred embodiment which incorporates and practices the principles of this invention. Other modifications and alterations are well within the knowledge of those skilled in the art and are to be included within the broad scope of the appended claims.

We claim:

1. A voltage control oscillator comprising:
   (a) a first field effect transistor ("FET"), having a drain, a gate and a source;
   (b) a second FET, having a drain, a gate and a source, wherein said drain of said first FET is cooperatively connected to said gate of said second FET and said drain of said second FET is cooperatively connected to said gate of said first FET; and
   (c) voltage means, cooperatively connected to said gate of said first and second FETs respectively, for supplying a voltage to said first and second FET gates, wherein when said first and second FETs are biased an oscillation loop is created, whereby when a resonator is cooperatively connected to said drain of said second FET the frequency of the oscillator is controlled.

2. The oscillator of claim 1, further comprising a resonator, cooperatively connected to said drain of said second FET.

3. The oscillator of claim 2, wherein said connections between said first drain and second gate, and said second drain and first gate is an alternating current connection, whereby only frequencies above a predetermined value pass between said first and second FET, and wherein said sources of said first and second FETs are connected to a ground potential.

4. The oscillator of claim 2, further comprising an output cooperatively connected to said drain of said first FET and said gate of said second FET, said output connected via a small capacitance coupling capacitor, wherein phase noise is decreased.

5. The oscillator of claim 2, further comprising resistor means, cooperatively connected between said first and second voltage sources and said first and second gates respectively, for reducing low frequency resonances.

6. The oscillator of claim 2, wherein said first and second FET have a negative resistance over the center bandwidth of the resonator frequency such that active feedback causes oscillations.

7. The oscillator of claim 3, further comprising an output cooperatively connected to said drain of said first FET and said gate of said second FET, said output connected via a small capacitance coupling capacitor, wherein phase noise is decreased.

8. The oscillator of claim 7, further comprising resistor means, cooperatively connected between said first and second voltage sources and said first and second gates respectively, for reducing low frequency resonances.

9. The oscillator of claim 8, wherein said first and second FET have a negative resistance over the center bandwidth of the resonator frequency such that active feedback causes oscillations.

10. The oscillator of claim 1, wherein the oscillator is a MESFET integrated circuit.

11. The oscillator of claim 1, wherein the oscillator is a HEMT integrated circuit.

12. The oscillator of claim 2 wherein said voltage means comprises first and second variable voltage supplies for independently biasing said first and second FET respectively.

13. The oscillator of claim 2, wherein said first and second FETs appear capacitive and said resonator provides an inductive load wherein the oscillation frequency is established as:

$$\omega_0 = (1/\sqrt{LC})$$

14. A radar comprising:
   (a) a voltage controlled oscillator including:
      (i) a first field effect transistor ("FET"), having a drain, a gate and a source;
      (ii) a second FET, having a drain, a gate and a source, wherein said drain of said first FET is cooperatively connected to said gate of said second FET and said drain of said second FET is cooperatively connected to said gate of said first FET; and
      (iii) first and second voltage means, cooperatively connected to said gate of said first and second FETs respectively, for supplying a voltage to said first and second FET gates, wherein when said first and second FETs are biased an oscillation loop is created, whereby when a resonator is cooperatively connected to said drain of said second FET the frequency of the oscillator is controlled; and
   (b) a mixer cooperatively connected to said oscillator; and
   (c) an antenna cooperatively connected to said mixer.

15. The radar of claim 14, further comprising:
   (a) a coupler cooperatively connected between said oscillator and said mixer; and
   (b) a duplexer cooperatively connected between said coupler and said mixer, wherein said antenna is connected to said duplexer.

16. A device for generating a signal comprising:

(a) a first active voltage controlled variable resistor means having three ports for controlling the resistance between a first port and a second port by varying a voltage supplied to said first active resistor means;

(b) a second active voltage controlled variable resistor means having three ports for controlling the resistance between a third port and a fourth port by varying a voltage supplied to said second active resistor means, wherien said first and second active resistor means are connected to one another such that active feedback occurs between said first and second active resistor means when biased thereby creating an oscillation signal;

(c) resonator means, cooperatively connected to said first active resistor means, for controlling the frequency of the oscillation signal; and (d) filter means for filtering D.C. signals between said first and second active resistor means, and wherein varying a second voltage supplied to said first and second active resistor means changes the frequency of the oscillation signal.

17. A device for generating a signal comprising:

(a) a first active voltage controlled variable resistor means having three ports for controlling the resistance between a first port and a second port by varying a voltage supplied to said first active resistor means;

(b) a seccond active voltage controlled variable resistor means having three ports for controlling the resistance between a third port and a fourth port by varying a voltage supplied to said second active resistor means, wherein said first and second active resistor means are connected to one another such that active feedback occurs between said first and second active resistor means when biased thereby creating an oscillation signal;

(c) resonator means, cooperatively connected to said first active resistor means, for controlling the frequency of the oscillation signal; and (d) an output cooperatively connected to said first active resistor means, said output connected via a small capacitance coupling capacitor, wherein phase noise is decreased, and wherein said output is connected to said first and second active resistor means such that said output is isolated from said resonator.

18. The device of claim 16, wherein said resonator is inductive and said first and second active resistor means appear capacitive, whereby the frequency of the oscillation signal is established.

19. The device of claim 16, wherein said first and second active resistor means are field effect transistors.

20. The device of claim 17, wherein said resonator is inductive and said first and second active resistor means appear capacitive, whereby the frequency of the oscillation signal is established.

21. The device of claim 17, wherein said first and second active resistor means are field effect transistors.

* * * * *

UNITED STATES PATENT AND TRADEMARK OFFICE
CERTIFICATE OF CORRECTION

PATENT NO. : 5,159,346

DATED : October 27, 1992

INVENTOR(S) : Donald M. Bosch, et al.

It is certified that error appears in the above-identified patent and that said Letters Patent is hereby corrected as shown below:

On the title page in the Inventors section after "Donald" please cancel "N" and insert --M--.

In column 9, line 29 please cancel "seccond" and substitute --second--.

Signed and Sealed this

Twelfth Day of October, 1993

Attest:

BRUCE LEHMAN

*Attesting Officer*     *Commissioner of Patents and Trademarks*